United States Patent [19]

Hayama

[11] Patent Number: 5,260,595
[45] Date of Patent: Nov. 9, 1993

[54] DIFFUSION RESISTOR HAVING SINGLE EVENT RESISTANCE USED IN SEMICONDUCTOR DEVICE

[75] Inventor: Masahide Hayama, Tokyo, Japan
[73] Assignee: NEC Corporation, Tokyo, Japan
[21] Appl. No.: 902,101
[22] Filed: Jun. 22, 1992
[30] Foreign Application Priority Data

Jun. 22, 1991 [JP] Japan ................................. 3-177365

[51] Int. Cl.⁵ ........................ H01L 27/02; H01C 7/10
[52] U.S. Cl. ................................. 257/379; 257/536; 338/22 R
[58] Field of Search ................... 257/379, 536; 338/22

*Primary Examiner*—Mark V. Prenty

[57] ABSTRACT

A diffusion resistor comprises a diffusion resistor region formed in a semiconductor layer of a first conductivity type. The diffusion resistor region is formed of a first impurity diffusion region of a second conductivity type opposite to the first conductivity type. A second impurity diffusion region of the second conductivity type is formed in the semiconductor layer separated from the first impurity diffusion region and to surround a side of the first impurity diffusion region. The second impurity diffusion region is connected to a high voltage or a low voltage.

9 Claims, 3 Drawing Sheets

DIFFUSION RESISTOR HAVING SINGLE EVENT RESISTANCE USED IN SEMICONDUCTOR DEVICE

BACKGROUND OF THE INVENTION

1. Field of the invention

The present invention relates to a semiconductor device, and particularly to a diffusion resistor having an improved single event resistance.

2. Description of Related Art

In a space environment, influence of spatial radiation acting on semiconductor devices has become an important problem. Recently, many large scaled integrated circuits have been used with complication of functions of earth satellites and rockets. The higher the integration density becomes, the less the amount of electric charge indicative of an item of data becomes, and therefore, it is forecasted that the circuit easily causes malfunction by one particle of ionization radiation. Namely, it has been pointed out that one particle of ionization radiation gives an significant influence on reliability. The malfunction caused by the radiation particle has been called a "single event".

It has been considered that the single event is caused by the following mechanisms:

(1) Direct Ionization Caused by Radiation

When an ionization radiation passes through or penetrates a semiconductor device, an energy of the radiation is given to the semiconductor device. At this time, ionized electric charges are generated within the semiconductor device by the energy given by the radiation, and electron-hole pairs are produced along a trace of the radiation. Of the electron-hole pairs thus produced, holes flow in a substrate direction as a hole current due to a drift, and electrons are attracted to a depletion layer by an electric field formed by the hole current. The drift of the electrons and the holes terminates when the holes has disappeared in the depletion layer. Under this condition, the following relation can be found:

$$R = W \cdot (\mu_n/\mu_p) \cdot \cos \theta$$

where W: width of depletion layer; $\mu_n$: mobility of electron; $\mu_p$: mobility of hole; $\theta$: incident angle of radiation; and R: funnelling length.

It can be considered that all ionized charges generated in the range of the funnelling length are trapped into a region of the depletion layer. Accordingly, the region of the depletion layer is apparently expanded or enlarged.

(2) Interaction of the radiation and silicon atoms

Radiation interacts on silicon atomic nuclei, with the result that a large amount of ionization occurs. In particular, particles such as protons, which exist in large quantities in the space environment, are high in probability of occurrence, and therefore, influence cannot be ignored.

In order to enhance the resistance to the above mentioned "single event", for example, in the case of MOS transistors, it has been proposed to minimize an area of a drain, or to form a dummy drain in proximity of the drain so that generated electric charges are absorbed by the dummy drain. On the other hand, in a circuit structure such as a flipflop and a memory cell particularly sensitive to electric charges, a resistor is inserted in a feedback loop so that the generated electric charges are absorbed by the feedback resistor. This feedback resistor is preferred to be as large as possible if it is allowed by a speed margin.

Conventionally, the resistor inserted in the feedback loop has been formed of polysilicon. However, a specific resistance $\rho_s$ of the polysilicon is relatively small, and therefore, it is difficult to obtain a large resistance because of restriction in a chip area. For this reason, it has been proposed to use a diffusion resistor having a large specific resistance $\rho_s$, in place of polysilicon resistor. However, the diffusion resistor itself generates electric charges in response to radiation, and therefore, it is feared that the "single event" resistance is rather lowered by using the diffusion resistor.

SUMMARY OF THE INVENTION

Accordingly, it is an object of the present invention to provide a diffusion resistor capable of overcoming the above mentioned defect of the conventional one.

Another object of the present invention is to provide a diffusion resistor which is assembled in a semiconductor device and which has an improved "single event" resistance.

A further object of the present invention is to provide a semiconductor device including a diffusion resistor having an improved "single event" resistance.

The above and other objects of the present invention are achieved in accordance with the present invention by a diffusion resistor comprising a diffusion resistor region formed in a semiconductor layer of a first conductivity type, the diffusion resistor region being formed of a first impurity diffusion region of a second conductivity type opposite to the first conductivity type, and a second impurity diffusion region of the second conductivity type formed in the semiconductor layer along each longitudinal side of the first impurity diffusion region separated from the first impurity diffusion region in a short distance, the second impurity diffusion region being fixed to a high voltage or a low voltage.

In a preferred embodiment, the second impurity diffusion region is formed to completely surround the first impurity diffusion region. The second impurity diffusion region is separated from the first impurity diffusion region by such a distance that a depletion layer of the second impurity diffusion region is contiguous to a depletion layer of the first impurity diffusion region.

In the above mentioned diffusion resistor, ionized electric charges generated by ionization radiation in the first impurity diffusion region functioning as the diffusion resistor, are absorbed through the depletion layer to the second impurity diffusion region adjacent to the first impurity diffusion region. Accordingly, the amount of the electric charges in the diffusion resistor formed by the first impurity diffusion region are reduced, so that the radiation resistance of the diffusion resistor is improved. Namely, the "single event" resistance is improved.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
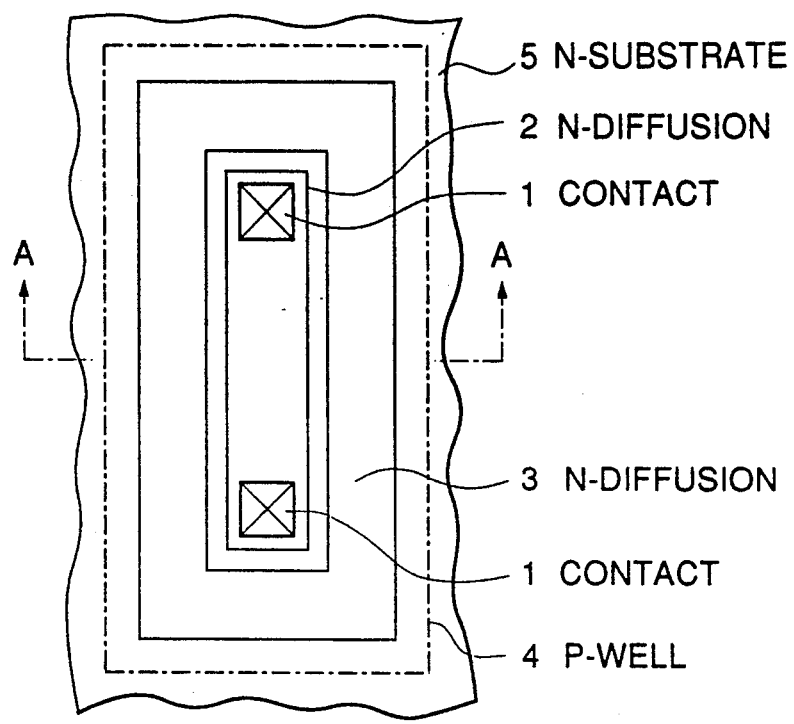
FIG. 1A is a diagrammatic layout pattern showing a first embodiment of the diffusion resistor in accordance with the present invention.
Figure 1B:
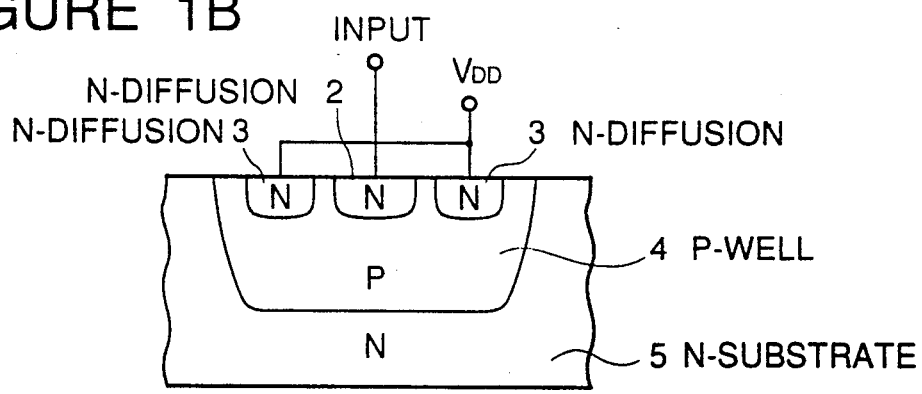
FIG. 1B is a sectional view taken along the line A—A in FIG. 1A.

Referring to FIG. 1, there is shown a diagrammatic layout pattern showing a first embodiment of the diffusion resistor in accordance with the present invention. FIG. 1B shows a sectional view taken along the line A—A in FIG. 1A.

The diffusion resistor includes an N type semiconductor substrate 5, for example, an N type silicon substrate. The substrate 5 includes a P type well 4 of an elongated rectangle in a plan view formed therein. An N type diffusion region 2, which is also of an elongated rectangle in a plan view, is formed in the P type well 4. This N type diffusion region 2 can be formed by selectively diffusing N type impurities into the P type well 4. An ohmic contact region 1 is formed in each of opposite ends of the N type diffusion region 2. The N type diffusion region 2 constitutes a diffusion resistor.

In addition, an N type diffusion region 3, which is the same conductivity type as that of the diffusion resistor 2, is formed within the P type well 4 so as to extend along each longitudinal side of the diffusion resistor 2. In the shown embodiment, the diffusion region 3 completely surrounds the diffusion resistor 2. The N type diffusion region 3 is separated from the N type diffusion region 2 by such a distance that a depletion layer of the N type diffusion region 3 is contiguous to a depletion layer of the N type diffusion region 2. The N type diffusion region 3 is connected to a high voltage $V_{DD}$. For example, the N type diffusion regions 2 and 3 have a depth of 1 μm, and a gap between the N type diffusion regions 2 and 3 is 0.5 μm.

Figure 2:
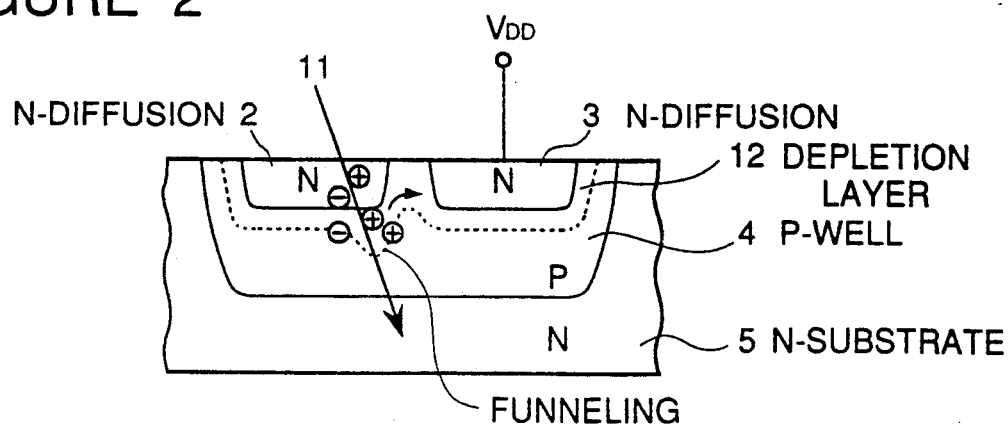
FIG. 2 is an enlarged diagrammatic sectional view for illustrating the operation of the diffusion resistor in accordance with the present invention.

With the above mentioned construction, if an ionization radiation 11 is injected into the diffusion region 2 as shown in FIG. 2, ionized electric charges are produced within a depletion layer region 12 of the diffusion region 2 along a trace of the ionization radiation 11. The generated electric charges start to flow through the depletion layer 12, and a portion of the generated electric charges flows into the diffusion layer 3 through the depletion layer 12, since the diffusion layer 3 connected to the fixed potential is provided adjacent to the diffusion region 2. Thus, the amount of the electric charges within the diffusion resistor region (diffusion region 2) is decreased. Accordingly, the radiation resistance in the diffusion resistor formed of the diffusion region 2 is improved. This diffusion resistor can be used as a feedback resistor of a flipflop or a memory cell which is required to have a high "single event" resistance. Therefore, it becomes possible to use a resistor having a specific resistance which is higher than that of a polysilicon resistor. Accordingly, a required area of a resistor can be reduced, and it is very effective in increasing the integration density of an integrated circuit. If the resistance per unit area of the diffusion resistor is made double of that of the polysilicon resistor, the required area of the diffusion resistor can be made a half of the required area of the polysilicon resistor. If the resistance per unit area of the diffusion resistor is made ten times that of the polysilicon resistor, the required area of the diffusion resistor can be made one tenth of the required area of the polysilicon resistor.

Figure 3A:
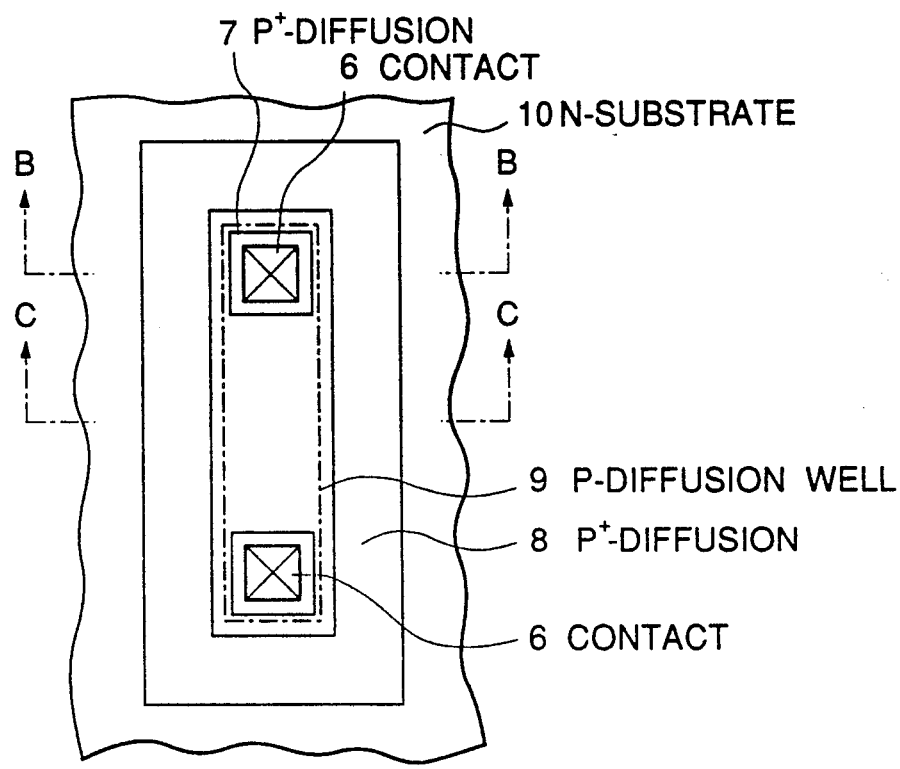
FIG. 3A is a diagrammatic layout pattern showing a second embodiment of the diffusion resistor in accordance with the present invention.
Figure 3B:
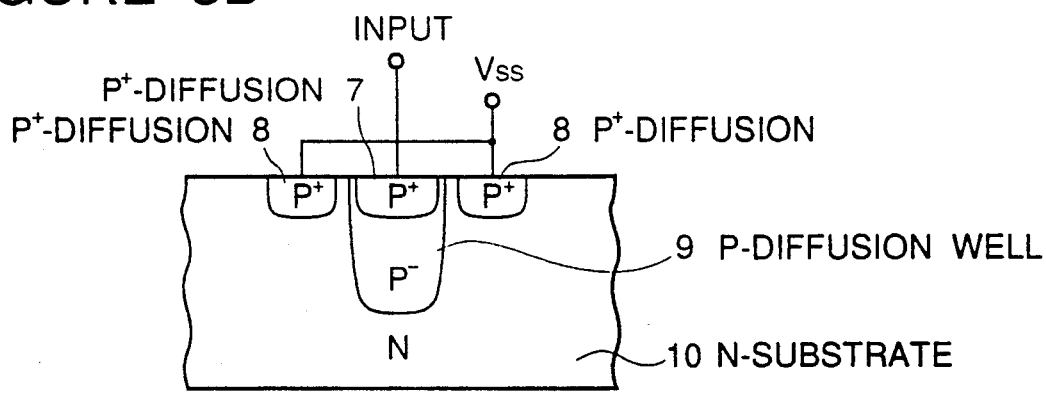
FIG. 3B is a sectional view taken along the line B—B in FIG. 3A.
Figure 3C:
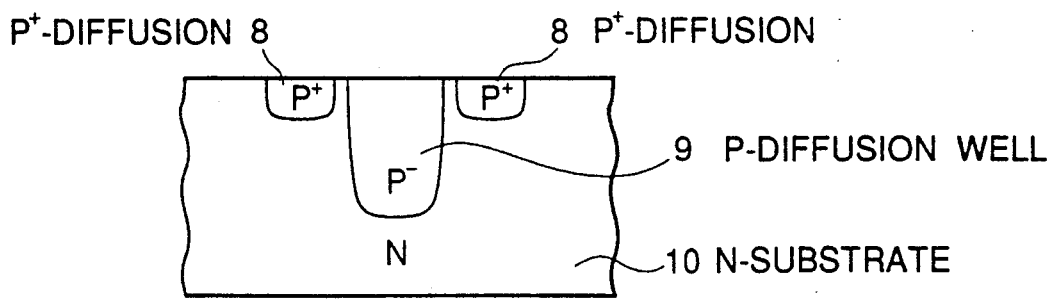
FIG. 3C is a sectional view taken along the line C—C in FIG. 3A.

Referring to FIG. 3A, there is shown a diagrammatic layout pattern showing a second embodiment of the diffusion resistor in accordance with the present invention. FIGS. 3B and 3C show sectional views taken along the line B—B and the line C—C in FIG. 3A, respectively. This second embodiment is configured to have a resistance higher than that of the first embodiment.

The second embodiment includes an N type semiconductor substrate 10, and a low concentration P type well 9 of an elongated rectangle in a plan view formed in the substrate 10. A high concentration P type diffusion region 7 is formed in each of opposite ends of the low concentration P type well 9, and a contact 6 is formed in each high concentration P type diffusion region 7. Thus, a diffusion resistor of a high resistance is formed of the P type well 9.

A P type diffusion region 8 is formed so as to completely surround the diffusion region 7, separated from the diffusion region 7 by such a distance that a depletion layer of the P type diffusion region 8 is contiguous to a periphery of the P type well 9. The P type diffusion region 8 is connected to a low potential $V_{SS}$. This P type diffusion region 8 functions to absorb generated electric charges.

As regards the mechanism for absorbing the generated electric charges, the second embodiment has the same as that of the first embodiment. However, since the impurity concentration of the P type well 9 is lower than that of the diffusion region 2 of the first embodiment, the depletion layer of the P type well 9 is larger than that of the diffusion region 2. Accordingly, a gap between the P type well 9 and the P type diffusion region 8 is required to be larger than the gap between the N type diffusion regions 2 and 3 in the first embodiment.

In the above mentioned embodiments, the elongated diffusion resistor regions 2 and 9 are completely surrounded by another diffusion regions 3 and 8 of the same conductivity type, respectively. However, the opposite ends of the diffusion resistor region provided with the contacts 1 or 6 do not substantially contribute a resistance value of the diffusion resistor. Therefore, the second diffusion regions 3 and 8 of the same conductivity type as that of the elongated diffusion resistor regions 2 and 9 can be modified to extend along and near to only each longitudinal side of the elongated diffusion resistor region, excluding the opposite ends of the diffusion resistor region.

Figure 4:
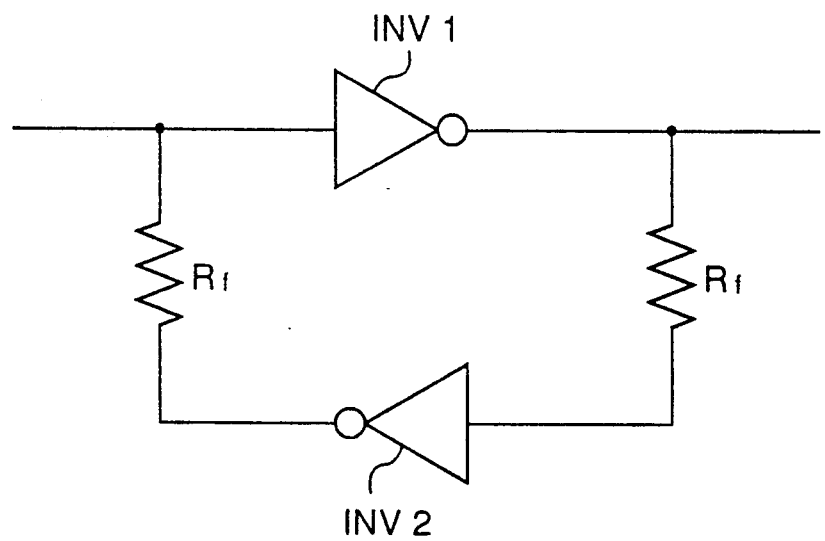
FIG. 4 is a circuit diagram of a semiconductor device which can use the diffusion resistor in accordance with the present invention.

Referring to FIG. 4, there is shown an example of a flipflop constituted of a pair of inverters INV1 and INV2, each of which has an output connected through a feedback resistor Rf to an input of the other inverter.

The diffusion resistor of the first and second embodiments can be used as the feedback resistor Rf shown in FIG. 4.

As mentioned above, according to the present invention, adjacent to the first impurity diffusion region constituting the diffusion resistor, there is formed the second impurity diffusion region of the same conductivity type as that of the impurity diffusion region. Thus, ionized electric charges generated by incident ionization radiation are absorbed by the second impurity diffusion region through the depletion layer, so that the amount of electric charges in the diffusion resistor is decreased. The radiation resistance can be elevated. Accordingly, if this diffusion resistor can be used as a feedback resistor of a flipflop or a memory cell which is required to have a high "single event" resistance, a large resistance can be obtained with an area which is smaller than that required in a polysilicon resistor. Accordingly, it is very effective in microminiaturizing the memory cell and the flipflop.

The invention has thus been shown and described with reference to the specific embodiments. However, it should be noted that the present invention is in no way limited to the details of the illustrated structures but changes and modifications may be made within the scope of the appended claims.

I claim:

1. A diffusion resistor comprising a semiconductor layer of a first conductivity type, an elongated diffusion resistor region formed in said semiconductor layer, said diffusion resistor region being formed of a first impurity diffusion region of a second conductivity type opposite to said first conductivity type, and a second impurity diffusion region of said second conductivity type formed in said semiconductor layer along each longitudinal side of said first impurity diffusion region and being separated from said first impurity diffusion region by such a distance that a depletion layer of said second impurity diffusion region is contiguous to a depletion layer of said first impurity diffusion region, said second impurity diffusion region being connected to a high voltage or a low voltage.

2. A diffusion resistor claimed in claim 1 wherein said second impurity diffusion region is formed to completely surround said first impurity diffusion region.

3. A diffusion resistor claimed in claim 1 wherein said semiconductor layer is formed of a P type well formed in an N type substrate, and said first and second impurity diffusion regions are of the N type, said second impurity diffusion region being connected to said high voltage.

4. A diffusion resistor claimed in claim 3 wherein said semiconductor layer is formed of an N type substrate, and said first and second impurity diffusion regions are of the P type, said second impurity diffusion region being connected to said low voltage.

5. A semiconductor device including a semiconductor layer of a first conductivity type, a diffusion resistor formed in said semiconductor layer, said diffusion resistor being formed of a first impurity diffusion region of a second conductivity type opposite to said first conductivity type, and a second impurity diffusion region of said second conductivity type formed in said semiconductor layer along each longitudinal side of said first impurity diffusion region and being separated from said first impurity diffusion region by such a distance that a depletion layer of said second impurity diffusion region is contiguous to a depletion layer of said first impurity diffusion region, said second impurity diffusion region being connected to a high voltage or a low voltage.

6. A semiconductor device including a pair of inverters each of which has an output connected through a feedback resistor to an input of the other inverter, said feedback resistor being formed in a semiconductor layer of a first conductivity type and having an elongated diffusion resistor region formed in said semiconductor layer, said diffusion resistor region being formed of a first impurity diffusion region of a second conductivity type opposite to said first conductivity type, and a second impurity diffusion region of said second conductivity type formed in said semiconductor layer along each longitudinal side of said first impurity diffusion region and being separated from said first impurity diffusion region by such a distance, that a depletion layer of said second impurity diffusion region is contiguous to a depletion layer of said first impurity diffusion region, said second impurity diffusion region being connected to a high voltage or a low voltage.

7. A semiconductor device claimed in claim 6 wherein said second impurity diffusion region is formed to completely surround said first impurity diffusion region.

8. A semiconductor device claimed in claim 6 wherein said semiconductor layer is formed of a P type well formed in an N type substrate, and said first and second impurity diffusion regions are of the N type, said second impurity diffusion region being connected to said high voltage.

9. A semiconductor device claimed in claim 8 wherein said semiconductor layer is formed of an N type substrate, and said first and second impurity diffusion regions are of the P type, said second impurity diffusion region being connected to said low voltage.

* * * * *